(12) United States Patent
Nakashiba

(10) Patent No.: US 9,159,759 B2
(45) Date of Patent: Oct. 13, 2015

(54) SOLID-STATE IMAGE PICKUP DEVICE

(75) Inventor: Yasutaka Nakashiba, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 92 days.

(21) Appl. No.: 13/078,676

(22) Filed: Apr. 1, 2011

(65) Prior Publication Data

US 2011/0175186 A1 Jul. 21, 2011

Related U.S. Application Data

(63) Continuation of application No. 11/774,039, filed on Jul. 6, 2007, now Pat. No. 7,939,825.

(30) Foreign Application Priority Data

Jul. 7, 2006 (JP) .................................. 2006-188530

(51) Int. Cl.
*H01L 27/148* (2006.01)
*H01L 27/146* (2006.01)

(52) U.S. Cl.
CPC ...... *H01L 27/14623* (2013.01); *H01L 27/1464* (2013.01); *H01L 27/14643* (2013.01)

(58) Field of Classification Search
CPC ................................................ H01L 27/14623
USPC .......................................... 257/225, E27.132
See application file for complete search history.

(56) References Cited

U.S. PATENT DOCUMENTS

| | | | |
|---|---|---|---|
| 4,454,526 A * | 6/1984 | Nishizawa et al. ........... | 257/292 |
| 6,188,093 B1 | 2/2001 | Isogai et al. | |
| 6,821,809 B2 | 11/2004 | Abe et al. | |
| 7,030,919 B2 | 4/2006 | Ohkubo et al. | |
| 8,384,176 B2 | 2/2013 | Furukawa et al. | |
| 2003/0025160 A1 * | 2/2003 | Suzuki et al. ................. | 257/347 |
| 2004/0005729 A1 | 1/2004 | Abe et al. | |
| 2004/0021786 A1 * | 2/2004 | Nakamura et al. ............ | 348/294 |

(Continued)

FOREIGN PATENT DOCUMENTS

| | | |
|---|---|---|
| JP | 59-056766 | 4/1984 |
| JP | 3-148172 | 6/1991 |

(Continued)

OTHER PUBLICATIONS

JP Office Action dated Jan. 17, 2012, with English Translation.

(Continued)

*Primary Examiner* — Matthew Landau
*Assistant Examiner* — Igwe U Anya
(74) *Attorney, Agent, or Firm* — Young & Thompson

(57) ABSTRACT

A solid-state image pickup device 1 includes a semiconductor substrate 10, light receiving unit 14 and light shielding film 20. The solid-state image pickup device 1 is back surface incident type and photoelectrically converts light indent on the back surface S2 of the semiconductor substrate 10 from an object into electrical charges and receives electrical charges produced by photoelectric conversion at the light receiving unit 14 to image the object. The light receiving unit 14 forms a PN junction diode with the semiconductor substrate 10. The light shielding film 20 is provided over a front surface S1 of the semiconductor substrate 10 so as to cover the light receiving unit 14. The light shielding film 20 serves to shield light incident on the front surface S1 from the outside of the solid-state image pickup device 1.

18 Claims, 3 Drawing Sheets

(56) References Cited

U.S. PATENT DOCUMENTS

| | | | |
|---|---|---|---|
| 2005/0030399 A1* | 2/2005 | Suzuki et al. | 348/294 |
| 2005/0167704 A1* | 8/2005 | Ezaki et al. | 257/233 |
| 2005/0227403 A1* | 10/2005 | Muramatsu | 438/57 |
| 2006/0033016 A1* | 2/2006 | Ogawa et al. | 250/221 |
| 2006/0043519 A1* | 3/2006 | Ezaki | 257/461 |
| 2006/0057820 A1* | 3/2006 | Yamanaka | 438/458 |
| 2006/0060899 A1* | 3/2006 | Hong et al. | 257/294 |
| 2006/0086956 A1* | 4/2006 | Furukawa et al. | 257/291 |
| 2006/0094151 A1* | 5/2006 | Sumi | 438/57 |
| 2006/0145213 A1* | 7/2006 | Ha | 257/292 |
| 2006/0192864 A1 | 8/2006 | Mauritzson | |
| 2006/0197007 A1* | 9/2006 | Iwabuchi et al. | 250/208.1 |
| 2006/0237629 A1 | 10/2006 | Oda | |
| 2007/0117253 A1* | 5/2007 | Hsu et al. | 438/75 |
| 2007/0139542 A1* | 6/2007 | Ohkubo et al. | 348/294 |
| 2007/0147215 A1* | 6/2007 | Sakaguchi et al. | 369/103 |
| 2007/0210239 A1* | 9/2007 | Lee et al. | 250/208.1 |
| 2007/0246746 A1* | 10/2007 | Ezaki et al. | 257/233 |
| 2008/0036022 A1* | 2/2008 | Hwang et al. | 257/432 |
| 2008/0061330 A1* | 3/2008 | Shiau et al. | 257/294 |
| 2008/0111169 A1* | 5/2008 | Liu et al. | 257/292 |

FOREIGN PATENT DOCUMENTS

| | | |
|---|---|---|
| JP | 5-218374 | 8/1993 |
| JP | 2000-012819 | 1/2000 |
| JP | 2000-252452 | 9/2000 |
| JP | 2002-033469 | 1/2002 |
| JP | 2003-264279 | 9/2003 |
| JP | 2003-273343 | 9/2003 |
| JP | 2003-303948 | 10/2003 |
| JP | 2006-120805 | 5/2006 |

OTHER PUBLICATIONS

JP Office Action dated Nov. 1, 2011, with English Translation.
JP Office Action dated Jun. 11, 2013, with English translation; Application No. 2011-281281.

* cited by examiner

SOLID-STATE IMAGE PICKUP DEVICE

BACKGROUND OF THE INVENTION

1. Field of the Invention

The present invention relates to a solid-state image pickup device.

2. Description of the Related Art

Japanese Patent Laid-Open No. 2002-33469 describes a back surface incident type of solid-state image pickup device. In the solid-state image pickup device, light incident on the back surface of a semiconductor substrate from an object is photoelectrically converted inside the semiconductor substrate. Electric charges produced by the conversion are received by a light receiving unit to image the object.

Japanese Patent Laid-Open No. 2000-252452 and Japanese Patent Laid-Open No. 03-148172 in addition to Japanese Patent Laid-Open No. 2002-33469 are known as a prior art document related to the present invention.

The present inventor has found that the above solid-state image pickup device had the following problems to be solved. That is to say, in the above solid-state image pickup device, stray light may enter a semiconductor substrate on which a light receiving unit is provided from the face (surface) on the side opposite to the back surface being an imaging surface. Stray light entering the semiconductor substrate generates a false signal, degrading a pickup image.

SUMMARY

According to one aspect of the present invention, there is provided a solid-state image pickup device photoelectrically converting light incident on the back surface of a semiconductor substrate into signal charges to image an object, the solid-state image pickup device comprising: a light receiving unit provided on side of a front surface of the semiconductor substrate in the semiconductor substrate, forming a PN junction diode with the semiconductor substrate and receiving the signal charges produced by the photoelectric conversion; and a light shielding film provided over the front surface of the semiconductor substrate so as to cover the light receiving unit, the light receiving unit being provided to prevent light incident on the front surface from the outside of the solid-state image pickup device.

According to another aspect of the present invention, there is provided a solid-state image pickup device comprising: a semiconductor body having a first main surface on which light is incident, the semiconductor body further having a second main surface opposite to the first main surface, a diffusion region formed at the second main surface of the semiconductor body to produce a electrical signal response to the light, and a light shielding film provided over the diffusion region.

A light shielding film is provided over the front surface of a semiconductor substrate in the solid-state image pickup device. This prevents stray light from entering the semiconductor substrate from the surface.

The present invention realizes the solid-state image pickup device capable of providing excellent pickup images.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
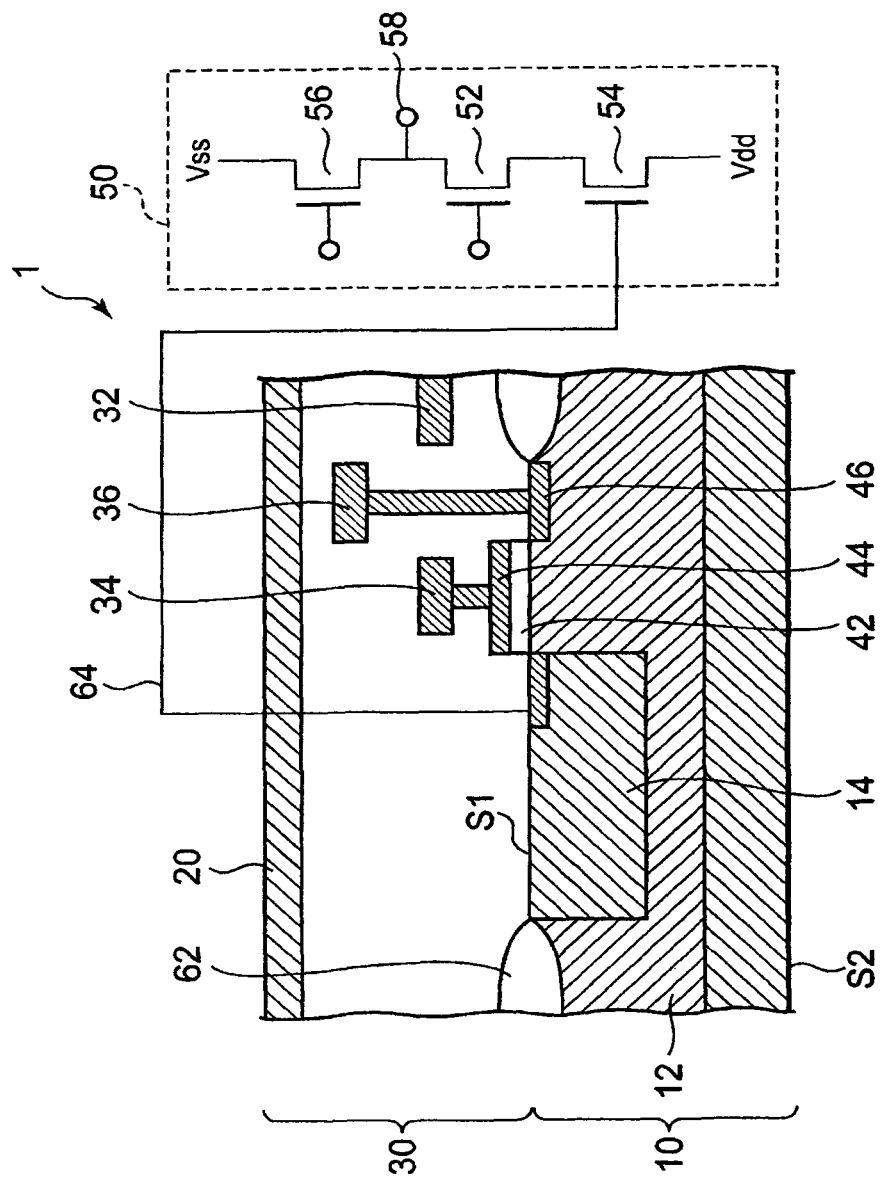
FIG. 1 is a cross section illustrating a first embodiment of a solid-state image pickup device according to the present invention.

Preferred embodiments of a solid-state image pickup device according to the present invention are described in detail below with reference to the drawings. In the description of the drawings the same constituent elements are given the same reference numerals to omit duplicated description.

First Embodiment

FIG. 1 is a cross section illustrating a first embodiment of a solid-state image pickup device according to the present invention. A solid-state image pickup device 1 includes a semiconductor substrate (semiconductor body) 10, light receiving unit (diffusion region) 14 and light shielding film 20. The solid-state image pickup device 1 is back surface incident type. More specifically, the solid-state image pickup device 1 at inside of the semiconductor substrate 10 photoelectrically converts light indent on the back surface (first main surface) S2 of the semiconductor substrate 10 from an object into electrical charges (signal charges) and receives electrical charges produced by photoelectric conversion at the light receiving unit 14 to image an object. Image pickup is preferably performed with the object directly brought into contact with the above back surface S2. The object is, for example, a finger.

The semiconductor substrate 10 in the present embodiment is a p-type silicon substrate. The semiconductor substrate 10 includes a p-type well region 12 in which the light receiving unit 14 is formed. The light receiving unit 14 is an n-type impurity diffusion layer (a first impurity diffusion layer) and forms a PN junction diode with the semiconductor substrate 10.

The light shielding film 20 is provided over the front surface (second main surface) S1 of the semiconductor substrate 10 so as to cover the light receiving unit 14. Here, the front surface S1 is defined as an element formation face of the semiconductor substrate 10, and the back surface S2 is defined as the surface opposite to the front surface S1. The light shielding film 20 covers the whole area where the light receiving unit 14 is provided. In the present embodiment, the light shielding film 20 covers, in particular, almost the whole area of the surface S1 of the semiconductor substrate 10. The light shielding film 20 serves to shield light incident on the surface S1 from the outside of the solid-state image pickup device 1.

On the semiconductor substrate 10 is provided an interconnect layer 30, in which the aforementioned light shielding film 20 is provided. The interconnect layer 30 includes interconnects 32, 34 and 36. The light shielding film 20 is formed by the same material as the interconnects 32, 34 and 36. The materials to be used in the light shielding film 20 include Al, Cu, W or Ti, for example.

A gate insulating film 42 is formed on the front surface S1 of the semiconductor substrate 10. The gate insulating film 42 is provided adjacent to the foregoing light receiving unit 14. A gate electrode 44 connected to the interconnect 34 is formed on the gate insulating film 42. The gate insulating film 42 and gate electrode 44 are formed by, for instance, silicon oxide and poly-silicon respectively.

Furthermore, an n-type impurity diffusion layer 46 (a second impurity diffusion layer) is provided beyond the gate insulating film 42 and the gate electrode 44 on the side opposite to the light receiving unit 14. In other words, the gate insulating film 42 and the gate electrode 44 are interposed between the n-type impurity diffusion layer 46 and the light receiving unit 14. The n-type impurity diffusion layer 46 is connected to the interconnect 36. The gate insulating film 42, gate electrode 44 and n-type impurity diffusion layer 46 form a field effect transistor (FET) with the light receiving unit 14. In the FET, the gate electrode 44 and n-type impurity diffusion layer 46 function as a reset gate and reset drain respectively. In addition, the FET is isolated from other elements by an element isolation region 62. The element isolation region 62 is, for example, a local oxidation of silicon (LOCOS) region or shallow trench isolation (STI) region.

A source follower amplifier 50 is connected to the light receiving unit 14 via an interconnect 64. Although the interconnect 64 is also formed in the interconnect layer 30, the interconnect 64 and source follower amplifier 50 are illustrated using the circuit diagram in FIG. 1.

The source follower amplifier 50 includes an FET 52 for a selective switch, FET 54 for detection and FET 56 for a load. These FETs are provided between a high-potential power supply terminal (Vdd) and a low-potential power supply terminal (Vss). Specifically, the FET 54 for detection, FET 52 for a selective switch and FET 56 for a load are connected to each other in series in this order from the power supply terminal (Vdd) to the power supply terminal (Vss). An output terminal 58 of the source follower amplifier 50 is connected to the drain terminal of the FET 56 for a load (or, to the terminal on the side of the FET 52 for a selective switch).

The operation of the solid-state image pickup device 1 is then described. Firstly, applying a high pulse to the gate electrode 44 is performed to reset the electric potential of the light receiving unit 14. Secondly, applying a low pulse to the gate electrode 44 is performed to stores electric charges produced by photoelectric conversion in the light receiving unit 14. Then, the electric potential of the light receiving unit 14 reaches a value depending on the quantity of stored electric charges, and an electric potential in response to the electric potential of the light receiving unit 14 is output from the output terminal 58 of the source follower amplifier 50.

The effects obtained by the solid-state image pickup device 1 are described. In the solid-state image pickup device 1, the light shielding film 20 is provided over the front surface S1 of the semiconductor substrate 1. This prevents stray light from entering the semiconductor substrate 10 from the surface S1, which realizes the solid-state image pickup device 1 capable of providing an excellent pickup image.

Covering the whole area where the light receiving unit 14 is provided by the light shielding film 20 enables pickup images to be effectively prevented from deteriorating due to stray light in particular. Furthermore, in the present embodiment, covering almost the whole area of the front surface S1 of the semiconductor substrate 10 by the light shielding film 20 permits stray light to be surely prevented from entering the semiconductor substrate 10.

The light shielding film 20 is provided in the interconnect layer 30 and formed of the same material as the interconnects 32, 34 and 36. This allows the light shielding film 20 to be formed in an interconnect forming process to facilitate forming the light shielding film 20, or producing the solid-state image pickup device 1. For instance, the light shielding film 20 is enabled to be formed simultaneously with an electrode pad (not shown).

The light receiving unit 14, gate insulating film 42, gate electrode 44 and n-type impurity diffusion layer 46 form an FET. Therefore, a configuration for resetting the electric potential of the light receiving unit 14 can be realized by a simple configuration.

Japanese Patent Laid-Open No. 03-148172 (hereafter, referred as the document) discloses a solid-state image pickup device in which a light shielding film is provided on the side of the surface of a semiconductor substrate. The solid-state image pickup device in the document, however, is different from the solid-state image pickup device 1 using the PN junction diode as a light receiving unit in that it uses a Schottky barrier diode as a light receiving unit. The solid-state image pickup device described in the document limits light to be used to infrared light (with a wavelength of approximately 5 μm or shorter), so that it cannot use the PN junction diode. In other words, if the solid-state image pickup device in the document uses the PN junction diode, a band gap is increased, so that the light receiving unit cannot sufficiently receive infrared light.

Since the solid-state image pickup device disclosed in the document is directed to detecting infrared light as stated above, it is sensitive to heat ray. If an object to be imaged is a finger, the solid-state image pickup device is influenced by heat ray from the whole finger. For that reason, the solid-state image pickup device is not suited for imaging a fingerprint. In this respect, the solid-state image pickup device 1 is suitably applied to imaging a fingerprint.

Since the solid-state image pickup device in the document is charge coupled device (CCD) type, its interconnect layer includes single layer of interconnect. Because of this, space where interconnect can be disposed in the interconnect layer is limited, which makes it difficult to form a light shielding film in the interconnect layer. Actually, the light shielding film is provided on the upper portion of the interconnect layer in the solid-state image pickup device in the document. Consequently, as is not the case with the solid-state image pickup device 1, the light shielding film cannot be formed in the interconnect forming process, increasing the number of processes for forming the light shielding film.

Second Embodiment

Figure 2:
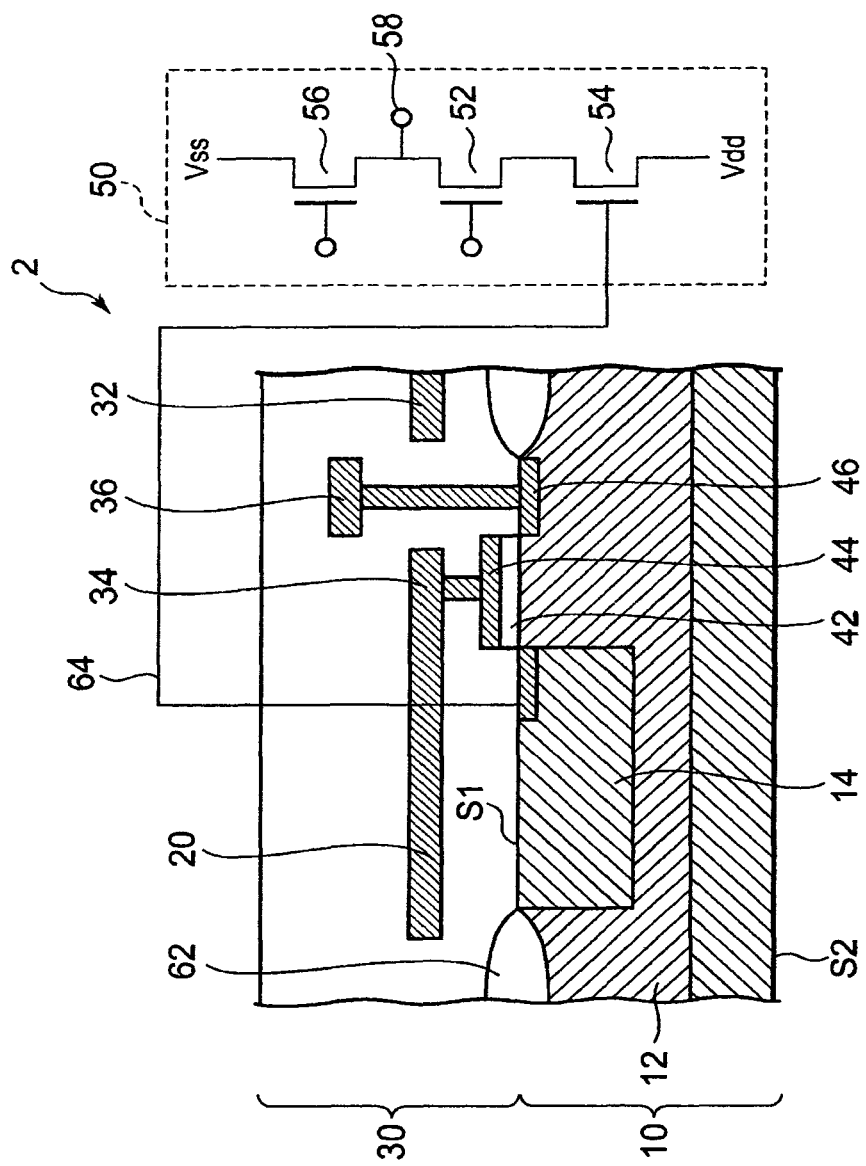
FIG. 2 is a cross section illustrating a second embodiment of a solid-state image pickup device according to the present invention.

FIG. 2 is a cross section illustrating a second embodiment of a solid-state image pickup device according to the present invention. In a solid-state image pickup device 2, a light shielding film 20 and an interconnect 34 are integrally formed. In other words, the light shielding film 20 is part of an interconnect in an interconnect layer 30 and functions both as a light shielding film and as an interconnect. In the present embodiment, the light shielding film 20 covers the whole area where the light receiving unit 14 is provided. However, the light shielding film 20 does not cover almost the whole area of the front surface S1 of the semiconductor substrate 10 as shown in FIG. 2. Other configurations and operations of the solid-state image pickup device 2 are the same as those of the solid-state image pickup device 1.

According to the solid-state image pickup device 2 thus formed, the light shielding film 20 and interconnect 34 are formed together to reduce the number of manufacturing processes. Other effects of the solid-state image pickup device 2 are the same as those of the solid-state image pickup device 1. It is to be understood that the light shielding film 20 may be integrated with interconnects (for example, interconnects 32 and 36) except the interconnect 34 in the interconnect layer 30 in the present embodiment.

Third Embodiment

Figure 3:
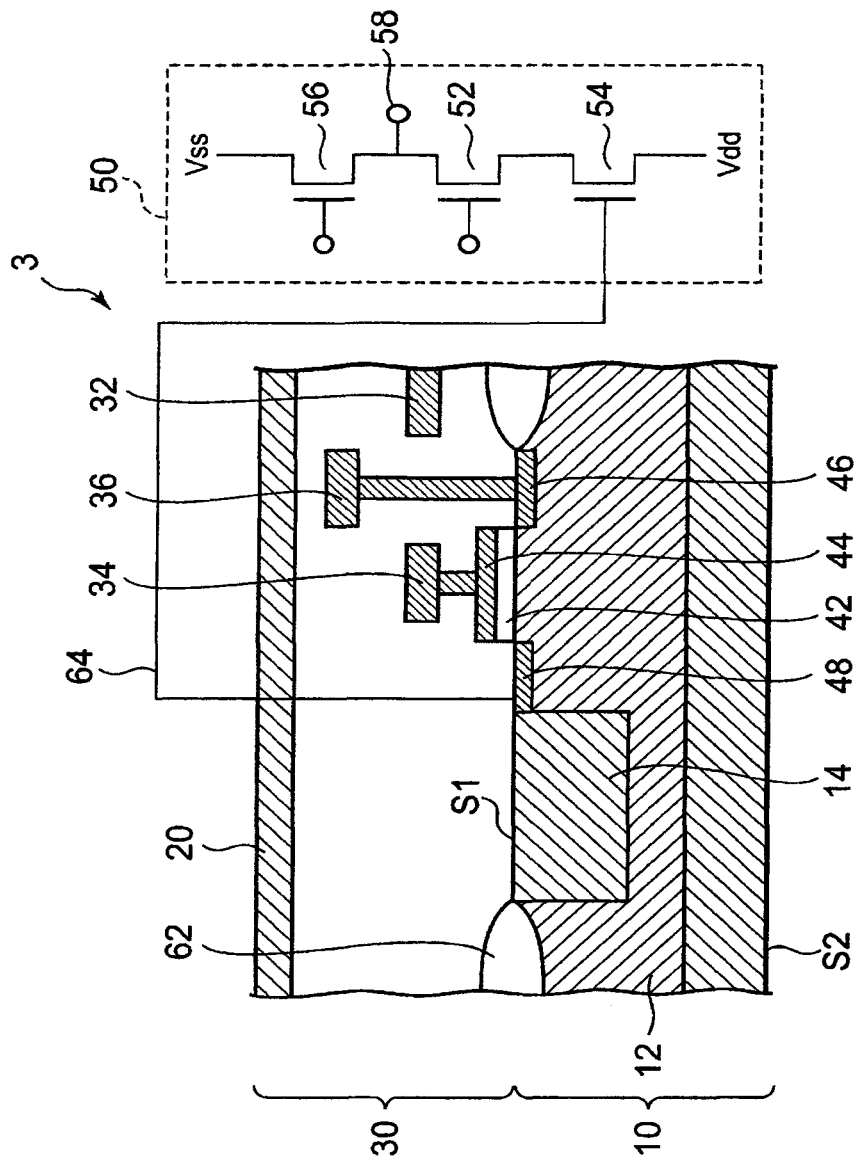
FIG. 3 is a cross section illustrating a third embodiment of a solid-state image pickup device according to the present invention.

FIG. 3 is a cross section illustrating a third embodiment of a solid-state image pickup device according to the present invention. In a solid-state image pickup device 3, an n-type impurity diffusion layer 48 (a second impurity diffusion layer) is formed in the semiconductor substrate 10 on the side of a front surface S1 of the semiconductor substrate 10. The n-type impurity diffusion layer 48 is provided adjacent to a light receiving unit 14. Furthermore, a gate insulating film 42 is provided adjacent to the n-type impurity diffusion layer 48 on the front surface S1 of the semiconductor substrate 10. A gate electrode 44 is formed on the gate insulating film 42. Still furthermore, an n-type impurity diffusion layer 46 (a third impurity diffusion layer) is provided beyond the gate insulating film 42 and the gate electrode 44 on the side opposite to the n-type impurity diffusion layer 48. In other words, the gate insulating film 42 and the gate electrode 44 are interposed between the n-type impurity diffusion layer 46 and n-type impurity diffusion layer 48.

The n-type impurity diffusion layer 48, gate insulating film 42, gate electrode 44 and n-type impurity diffusion layer 46 form an FET. Also in the FET, the gate electrode 44 and n-type impurity diffusion layer 46 function as a reset gate and reset drain respectively. Other configurations and operations of the solid-state image pickup device 3 are the same as those of the solid-state image pickup device 1. The effects of the solid-state image pickup device 3 are also the same as those of the solid-state image pickup device 1. Also in the present embodiment, as is the case with the solid-state image pickup device 2, the light shielding film 20 may be integrated with the interconnects in the interconnect layer 30.

The solid-state image pickup device according to the present invention is not limited to the above embodiments, but may be modified in various forms. Although the p-type semiconductor substrate and n-type light receiving unit are taken as examples in the above embodiments, the n-type semiconductor substrate and p-type light receiving unit may be used.

It is apparent that the present invention is not limited to the above embodiments, but may be modified and changed without departing from the scope and spirit of the invention.

What is claimed is:
1. A solid-state image pickup device, comprising:
  a light receiving unit that converts light incident on a back surface of a semiconductor substrate, said light receiving unit located on a side of a front surface of said semiconductor substrate and within a thickness of said semiconductor substrate;
  an interconnect layer located over the side of the front surface of said semiconductor substrate;
  a light shielding film located in said interconnect layer that covers said light receiving unit and prevents light incident on the front surface from entering the semiconductor substrate;
  a transistor formed adjacently to said light receiving unit;
  an interconnect electrically connected to said transistor; and
  an element isolation region, in at least one of the interconnect layer and the semiconductor substrate, that isolates the transistor,
  wherein said interconnect is formed between said light receiving unit and said light shielding film,
  wherein said light shielding film covers said transistor, said interconnect, said light receiving unit, and said element isolation region, and
  wherein said light shielding film is not electrically connected to said interconnect.

2. The solid-state image pickup device according to claim 1, wherein said light shielding film covers substantially a whole area of said front surface of the semiconductor substrate.

3. The solid-state image pickup device according to claim 1, wherein said light shielding film is formed of a same material as said interconnect.

4. The solid-state image pickup device according to claim 3, wherein said light shielding film is electrically connected to said interconnect layer.

5. The solid-state image pickup device according to claim 4, wherein said light shielding film is part of said interconnect.

6. The solid-state image pickup device according to claim 1, wherein the back surface of said semiconductor substrate is an imaging surface with which an object is directly brought into contact.

7. The solid-state image pickup device according to claim 1, wherein said solid-state image pickup device photoelectrically converts light incident on a back surface of said semiconductor substrate into signal charges to image an object, and said object is a finger.

8. The solid-state image pickup device according to claim 1, wherein said light receiving unit is a first impurity diffusion layer.

9. The solid-state image pickup device according to claim 8, further comprising:
  a gate insulating film provided adjacent to said light receiving unit on said front surface of said semiconductor substrate;
  a gate electrode provided on said gate insulating film; and
  a second impurity diffusion layer provided on the side of said front surface of said semiconductor substrate and within the thickness of said semiconductor substrate, said second impurity diffusion layer being disposed so that said gate insulating film and said gate electrode are interposed between said second impurity diffusion layer and said light receiving unit,
  wherein said light receiving unit, said gate insulating film, said gate electrode and said second impurity diffusion layer form a field effect transistor.

10. The solid-state image pickup device according to claim 8, further comprising:
  a second impurity diffusion layer provided adjacent to said light receiving unit on the side of said front surface of said semiconductor substrate in said semiconductor substrate;
  a gate insulating film provided adjacent to said second impurity diffusion layer on said front surface of said semiconductor substrate;
  a gate electrode provided on said gate insulating film; and
  a third impurity diffusion layer provided on the side of said front surface of said semiconductor substrate in said semiconductor substrate, said third impurity diffusion layer being disposed so that said gate insulating film and said gate electrode are interposed between said second impurity diffusion layer and said third impurity diffusion layer,
  wherein said second impurity diffusion layer, said gate insulating film, said gate electrode and said third impurity diffusion layer form a field effect transistor.

11. The solid-state image pickup device according to claim 1, wherein the element isolation region is a local oxidation of silicon (LOCOS) region.

12. The solid-state image pickup device according to claim 1, wherein the element isolation region is a shallow trench isolation (STI) region.

13. The solid-state image pickup device according to claim 1, wherein the back surface is an imaging surface.

14. The solid-state image pickup device according to claim 1, wherein the light shielding film covers an entire area where the light receiving unit is located.

15. The solid-state image pickup device according to claim 1, wherein said interconnect, which is not electrically connected to the light shielding film, is electrically connected to an n-type impurity diffusion layer of said transistor, said transistor forming a field effect transistor.

16. A solid-state image pick-up device, comprising:
a light receiving unit formed in a semiconductor substrate that receives light incident on a back surface of said semiconductor substrate;
an interconnect layer formed over a front surface of said semiconductor substrate;
an interconnect formed in said interconnect layer;
a light shielding film formed in said interconnect layer that prevents light incident on the front surface from entering the semiconductor substrate; and
an element isolation region in at least one of the interconnect layer and the semiconductor substrate,
wherein said interconnect is formed between said semiconductor substrate and said light shielding film,
wherein said light shielding film covers said light receiving film, said interconnect, and said element isolation region,
wherein said interconnect is made of copper, and
wherein said light shielding film, which is not electrically connected, forms an upper interconnect.

17. The solid-state image pick-up device according to claim 16, wherein the back surface of said semiconductor substrate is an imaging surface with which an object is directly brought into contact.

18. The solid-state image pick-up device according to claim 16, wherein the light shielding film covers an entire area where the light receiving unit is located.

* * * * *